United States Patent
Lee et al.

(10) Patent No.: US 10,056,537 B2
(45) Date of Patent: Aug. 21, 2018

(54) FLEXIBLE THERMOELECTRIC MODULE APPARATUS

(71) Applicant: Kookmin University Industry Academy Cooperation Foundation, Seoul (KR)

(72) Inventors: Hyunjung Lee, Seoul (KR); Yongmyeong Kim, Daegu (KR); Hyunwoo Bark, Seoul (KR); Woohyung Choi, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 62 days.

(21) Appl. No.: 14/852,680

(22) Filed: Sep. 14, 2015

(65) Prior Publication Data
US 2016/0111622 A1    Apr. 21, 2016

(30) Foreign Application Priority Data
Oct. 21, 2014  (KR) ........................ 10-2014-0142838

(51) Int. Cl.
*H01L 35/32* (2006.01)
*H01L 35/30* (2006.01)
*H01L 35/06* (2006.01)
*H01L 35/10* (2006.01)

(52) U.S. Cl.
CPC .............. *H01L 35/32* (2013.01); *H01L 35/06* (2013.01); *H01L 35/10* (2013.01); *H01L 35/30* (2013.01)

(58) Field of Classification Search
USPC .................................................. 136/200–242
See application file for complete search history.

(56) References Cited

U.S. PATENT DOCUMENTS

| | | | | |
|---|---|---|---|---|
| 3,018,430 A | * | 1/1962 | Pack | H01L 35/00 307/110 |
| 3,430,079 A | * | 2/1969 | McCoy | G21C 3/40 136/202 |
| 3,437,847 A | * | 4/1969 | Raspet | H01J 45/00 136/202 |

(Continued)

FOREIGN PATENT DOCUMENTS

KR    10-1265145 B1    5/2013

*Primary Examiner* — Liesl C Baumann
(74) *Attorney, Agent, or Firm* — Paratus Law Group, PLLC

(57) ABSTRACT

The present invention relates to a flexible thermoelectric module apparatus, and more particularly, to a flexible thermoelectric module apparatus including a heat sink longitudinally extending and a thermoelectric module disposed in the heat sink, in which the heat sink has a pipe-shaped body constituting a main body and a hole longitudinally formed through the center portion of the body, the thermoelectric module has a plurality of thermoelectric plates, the thermoelectric plates are plates having predetermined length and width, are arranged longitudinally in parallel with the heat sink, with a first side in the width direction connected to the inner side of the body and a second side disposed inside the hole, are arranged in parallel with each other at circumferentially predetermined distances from each other in the hole, and have a predetermined angle to the radial direction of the heat sink such that they are inclined at a predetermined angle therebetween.

16 Claims, 18 Drawing Sheets

(56) References Cited

U.S. PATENT DOCUMENTS

| | | | | | |
|---|---|---|---|---|---|
| 3,794,527 | A * | 2/1974 | Kim | | H01L 35/32 136/205 |
| 5,411,600 | A * | 5/1995 | Rimai | | H01L 35/34 136/201 |
| 7,921,640 | B2 * | 4/2011 | Major | | F02G 5/02 165/51 |
| 2003/0140957 | A1 * | 7/2003 | Akiba | | H01L 35/30 136/224 |
| 2005/0217714 | A1 * | 10/2005 | Nishijima | | F01N 5/025 136/204 |
| 2006/0107986 | A1 * | 5/2006 | Abramov | | F25B 21/02 136/204 |
| 2006/0179849 | A1 * | 8/2006 | Abramov | | H01L 23/38 62/3.3 |
| 2010/0186422 | A1 * | 7/2010 | Yang | | H01L 35/30 62/3.3 |
| 2010/0212713 | A1 * | 8/2010 | Sasaki | | H01L 35/32 136/233 |
| 2010/0326487 | A1 * | 12/2010 | Komori | | H01L 35/32 136/226 |
| 2013/0037073 | A1 * | 2/2013 | LaGrandeur | | H01L 35/30 136/224 |
| 2013/0098418 | A1 * | 4/2013 | Polcyn | | C03B 5/235 136/205 |
| 2013/0104953 | A1 * | 5/2013 | Poliquin | | H01L 35/30 136/224 |
| 2013/0152561 | A1 * | 6/2013 | An | | F01N 5/025 60/320 |
| 2013/0160434 | A1 * | 6/2013 | An | | F01N 5/025 60/320 |
| 2013/0186448 | A1 * | 7/2013 | Ranalli | | F01N 5/025 136/204 |
| 2013/0228205 | A1 * | 9/2013 | Vernikovskiy | | H01L 35/30 136/205 |

* cited by examiner

FLEXIBLE THERMOELECTRIC MODULE APPARATUS

CROSS-REFERENCE TO RELATED APPLICATIONS

This application claims the priority of Korean Patent Application No. 2014-0142838 filed on Oct. 21, 2014, in the Korean Intellectual Property Office, the disclosure of which is incorporated herein by reference.

BACKGROUND OF THE INVENTION

Field of the Invention

The present invention relates to a flexible thermoelectric module apparatus, and more particularly, to a flexible thermoelectric module apparatus including a heat sink longitudinally extending and a thermoelectric module disposed in the heat sink, in which the heat sink has a pipe-shaped body constituting a main body and a hole longitudinally formed through the center portion of the body, the thermoelectric module has a plurality of thermoelectric plates, the thermoelectric plates are plates having predetermined length and width, are arranged longitudinally in parallel with the heat sink, with a first side in the width direction connected to the inner side of the body and a second side disposed inside the hole, are arranged in parallel with each other at circumferentially predetermined distances from each other in the hole, and have a predetermined angle to the radial direction of the heat sink such that they are inclined at a predetermined angle therebetween.

Description of the Related Art

An internal combustion engine generates power by burning specific fuel. In this process, a large amount of waste heat is produced, and particularly, a large amount of waste heat is included in an exhaust gas discharged through an exhaust pipe.

A thermoelectric element is a device that generates electricity, using a temperature difference, and when electricity is generated using waste heat, energy can be recycled and energy efficiency of an internal combustion engine can be improved.

However, it is an important problem for the thermoplastic element to increase energy generation efficiency by increasing the temperature difference between a hot side and a cold side of thermoelectric elements.

It is very important to study high-efficiency thermoelectric active materials in the thermoelectric field. A property of a thermoelectric material, so-called figure of merit is expressed by ZT.

$$ZT = \frac{S^2 \sigma}{k} T$$

In this equation, Z is figure of merit of a thermoelectric material, S is seebeck coefficient, σ is electric conductivity, k is thermal conductivity, and T is temperature. In order to achieve high figure of merit, high seebeck coefficient and electric conductivity and low thermal conductivity are required. Since the thermal conductivity follows Wiedemann-Franz law, so it is difficult to control independently from the electric conductivity, but it is possible to decrease the entire thermal conductivity by controlling the nanostructure of a material.

Since Bi2Te3 has been discovered as a low-temperature thermoelectric material, the maximum ZT remains now at about 1. When ZT is larger than 2, a thermoelectric system may concur with a common technology of, for example, temperature control. The use and application of thermoelectrics depend directly on the parameter, ZT, and when a thermoelectric element is formed in a module, the following efficiency equation is obtained.

$$\eta = \frac{\Delta T}{T_h} \cdot \frac{\sqrt{1+ZT} - 1}{\sqrt{1+ZT} \cdot \frac{T_c}{T_h}}$$

In this equation, ZT is a property of a thermoelectric material, $\Delta T$ is $T_h - T_c$, $T_h$ is at the temperature of a hot side, at a portion being in contact with an exhaust pipe and $T_c$ is the temperature of a cold side, at a portion attached to a heat sink.

As can seen from the equation, even if there is a difference of 1° C. or more between $T_h$ and $T_c$, a thermoelectric module generates electric energy, and the larger the difference between $T_h$ and $T_c$, the larger the efficiency. For example, for ZT=1, $\Delta T$=50° C., $T_h$=100° C., and $T_c$=50° C., $$\eta = \frac{50}{100} \cdot \frac{\sqrt{1+1} - 1}{\sqrt{1+1} + \frac{50}{100}} = 0.10819 - \text{about } 10.82\%$$

Efficiency of about 10.82% is achieved, and when the number of flexible thermoelectric modules increases, more electric energy will be generated.

However, when the temperature of the hot side increases, the efficiency decreases in the equation, so it is required to increase the temperature difference between the cold side and the hot side as much as the increase in temperature of the hot side.

DOCUMENTS OF RELATED ART

Patent Document

Korean Patent No. 10-1265145

SUMMARY OF THE INVENTION

An aspect of the present invention provides a flexible thermoelectric module apparatus including a heat sink longitudinally extending and a thermoelectric module disposed in the heat sink, in which the heat sink has a pipe-shaped body constituting a main body and a hole longitudinally formed through the center portion of the body, the thermoelectric module has a plurality of thermoelectric plates, the thermoelectric plates are plates having predetermined length and width, are arranged longitudinally in parallel with the heat sink, with a first side in the width direction connected to the inner side of the body and a second side disposed inside the hole, are arranged in parallel with each other at circumferentially predetermined distances from each other in the hole, and have a predetermined angle to the radial direction of the heat sink such that they are inclined at a predetermined angle therebetween.

According to an aspect of the present invention, there is provided a flexible thermoelectric module apparatus that includes a heat sink longitudinally extending and a thermoelectric module disposed in the heat sink, in which the heat sink has a pipe-shaped body constituting a main body and a hole longitudinally formed through the center portion of the body, the thermoelectric module has a plurality of thermoelectric plates, and the thermoelectric plates are plates having predetermined length and width, are arranged longitudinally in parallel with the heat sink, with a first side in the width direction connected to the inner side of the body and a second side disposed inside the hole, are arranged in parallel with each other at circumferentially predetermined distances from each other in the hole, and have a predetermined angle to the radial direction of the heat sink such that they are inclined at a predetermined angle therebetween.

Preferably, first sides in the width direction of the thermoelectric plates are in contact with other thermoelectric plates and second sides in the width direction of the thermoelectric plate define a cylindrical shape in which a predetermined exhaust pipe is disposed.

Preferably, the thermoelectric plate is made of a flexible material, can bend, and has flexibility and a radius of curvature of 1 mm to 10 mm.

Preferably, the body has a plurality of triangular protrusions having a predetermined projection angle and two slopes on the inner side defining the hole, the protrusions are circumferentially repeatedly formed in parallel with each other such that corrugations and ridges are alternately formed on the inner side of the body, and the thermoelectric plates are arranged in contact with first slopes of the protrusions, respectively.

Preferably, the apparatus further includes coolant pipes in which a coolant flows, and the coolant pipes are disposed through the body of the heat sink.

Preferably, the coolant pipes extend in the longitudinal direction of the heat sink along the corrugations.

Preferably, the apparatus further includes a plurality of connecting terminals, and the connecting terminals are disposed between the thermoelectric plates and connect the thermoelectric plates in series.

Preferably, the connecting terminals extend along the outer side of the heat sink, partially bend, and are connected to both ends of the thermoelectric plates.

Preferably, the connecting terminals include a plurality of first connecting terminals connected to lateral both ends of the thermoelectric plates and a plurality of second connecting terminals, the first connecting terminals connect first ends of two adjacent thermoelectric plates, the second connecting terminals connect second ends of two adjacent thermoelectric plates, and the thermoelectric plates are connected in series by connecting the first connecting terminal and the second connecting terminal to both ends of any one thermoelectric plates, respectively, and connecting the first connecting terminal and the second connecting terminal to another thermoelectric plate, respectively.

Preferably, the apparatus further include a plurality of moving terminals that change positions, and the moving terminals connect the thermoelectric plates in parallel by connecting the connecting terminals.

Preferably, the moving terminals include a plurality of first moving terminal connected to lateral both ends of the thermoelectric plates and a plurality of second moving terminals, and the first moving terminals connecting the first connecting terminals and the second moving terminals connect the second connecting terminals, so the thermoelectric plates are connected in parallel.

Preferably, the moving terminals have a parallel connection mode that connects adjacent connecting terminals and a series connection mode that disconnects adjacent connecting terminals, by moving along the outer side of the heat sink.

Preferably, the apparatus further includes caps coupled to both ends of the heat sink, in which the caps are detachably coupled to the heat sink.

Preferably, the apparatus further includes caps coupled to both ends of the heat sink, in which the caps are disposed rotatably in the circumferential direction of the heat sink, and the moving terminals are disposed inside the caps, so when the moving terminals are moved with rotation of the caps, a parallel mode and a series mode are changed.

Preferably, the housing includes a flexible material and is developed into one plate by being laterally divided by separation lines that are longitudinally formed, and a cylindrical configuration is achieved by rolling the housing and connecting both lateral ends.

Preferably, the housing is laterally divided into two parts by two separation lines that are longitudinally formed, and one of the parts is hinged to turn and the other one is connected by a predetermined locking device to be opened/closed.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
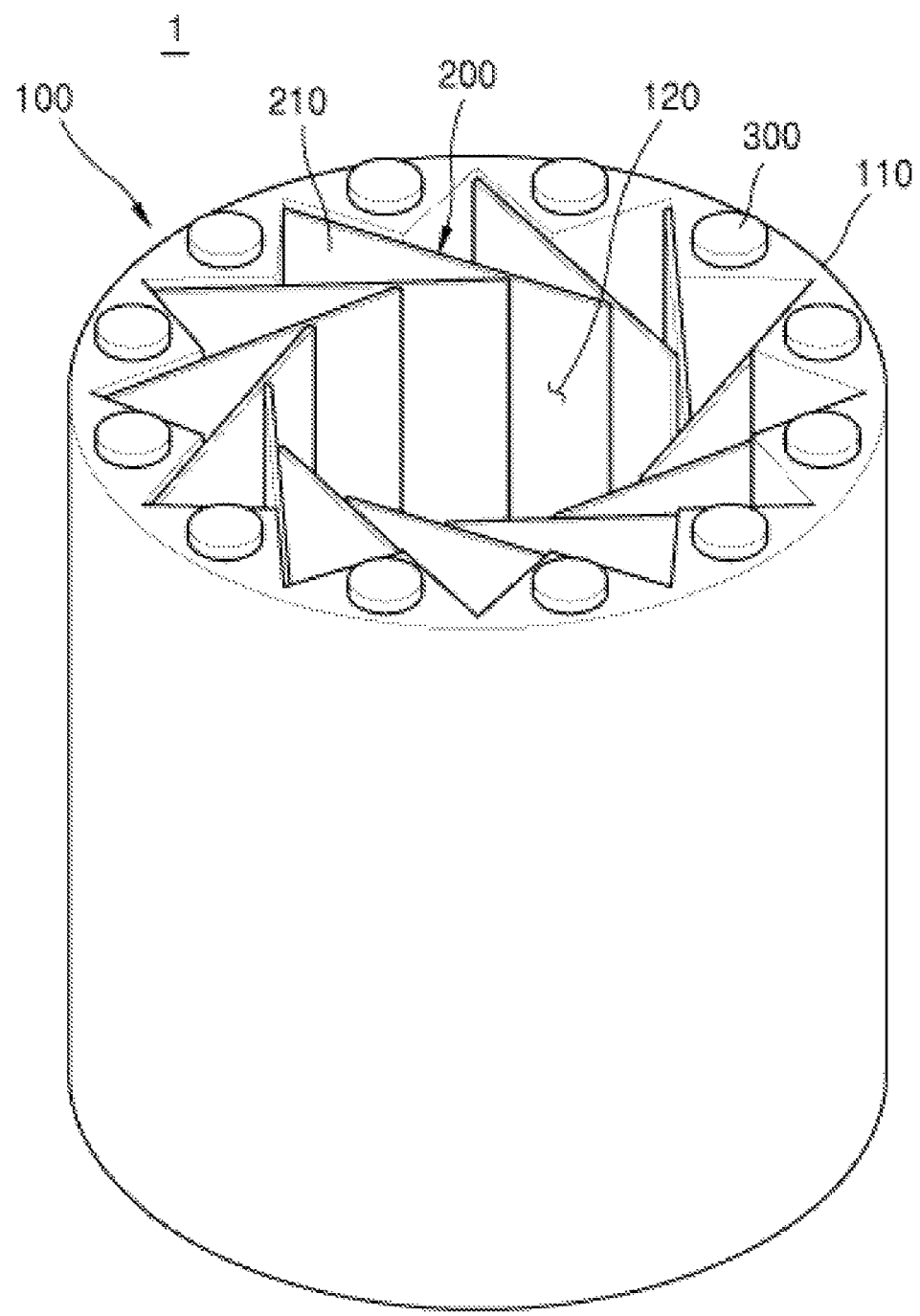
FIG. 1 is a view illustrating a flexible thermoelectric module apparatus according to an embodiment of the present invention.

Exemplary embodiments of the present invention will now be described in detail with reference to the accompanying drawings.

Hereinafter, exemplary embodiments of the present invention will be described with reference to accompanying drawings. The embodiments are not intended to limit the present invention.

Advantages and features of the present invention and methods for achieving them will become apparent from the descriptions of exemplary embodiments herein below with reference to the accompanying drawings. However, the present invention is not limited to the embodiments described hereafter and may be implemented in various ways, the exemplary embodiments are provided to complete the description of the present invention and let those skilled in the art completely know the scope of the present invention, and the present invention is defined by claims. Like reference numerals denote like elements throughout the descriptions.

The spatially relative terms "up", "down", "left", and "right" may be used to easily explain the relationships between one member or components and another element of components, as illustrated in the drawings. The spatially relative terms should be understood as including other directions of members being used or moved, in addition to the directions illustrated in the drawings. For example, when a member is placed transversely, the "up-down" may be construed as "left-right". Accordingly, the exemplary terms "up" and "down" may include both "left" and "right". The member may be arranged in another direction, and accordingly, the spatially relative terms may be construed in accordance with arrangement.

The terminologies used herein are provided for explaining embodiments, not limiting the present invention. Singular terms include plural terms herein, unless specifically stated. The term "comprise" and/or "comprising" used herein may include not only the stated component, step, operation and/or member, but one or more other components, steps, operations and/or members.

Unless defined in other ways, all of terminologies (including technical and scientific terminologies) used herein may be used as meaning that those skilled in the art can understand. Further, common terms defined in dictionaries should not be construed abnormally or excessively, unless specifically and clearly defined.

The thickness or size of members is exaggerated or omitted, or schematically illustrated for convenience and clearness of description. Further, the size and area of components do not correspond to the actual size or area.

Further, the angle and direction stated in the process of explaining a structure in the embodiments of the present invention are based on those in the drawings. In the description of a structure of the present invention, unless the reference point and the relationship of angles are clearly stated, refer to the relevant drawings.

Figure 2:
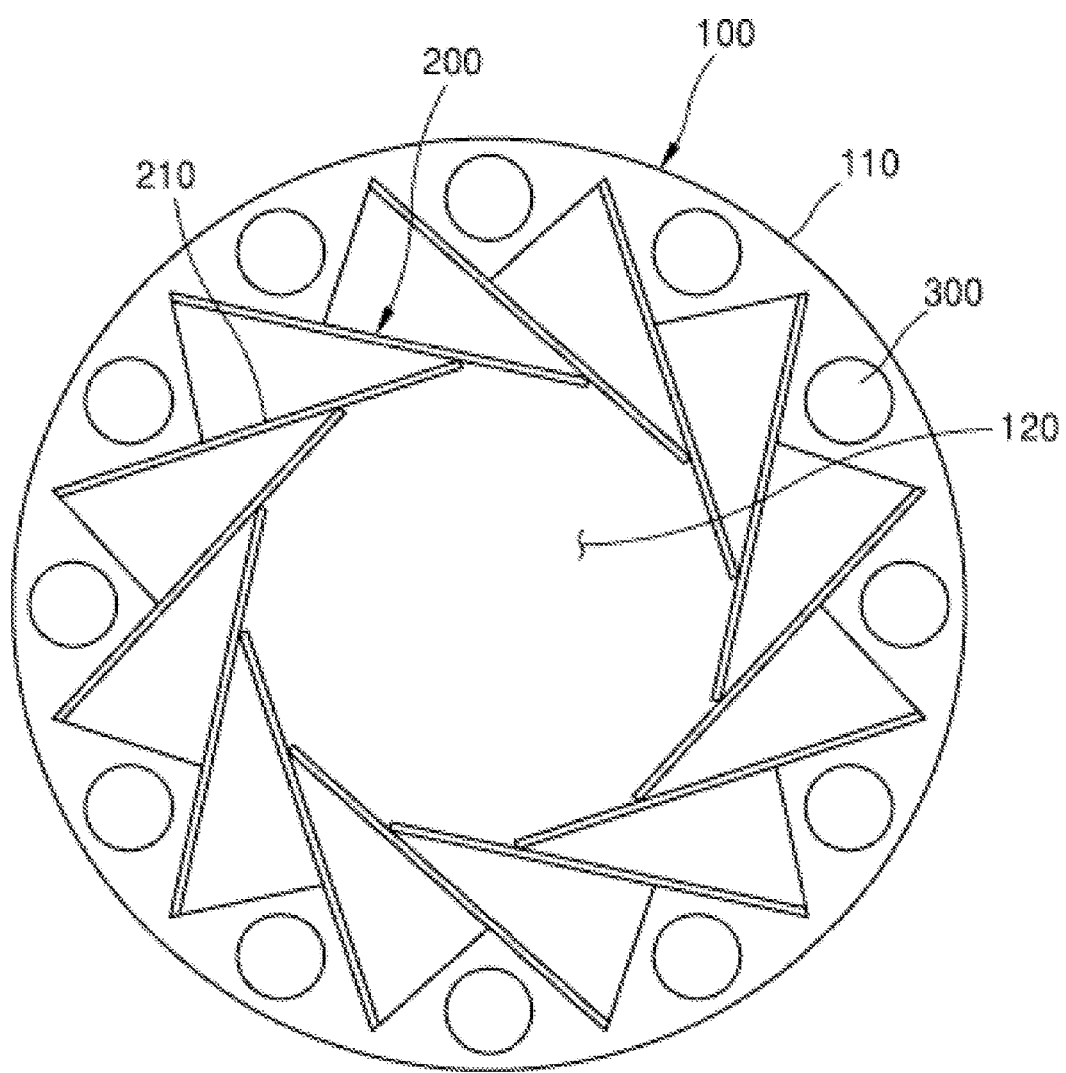
FIG. 2 is a view illustrating the flexible thermoelectric module apparatus according to an embodiment of the present invention.
Figure 3:
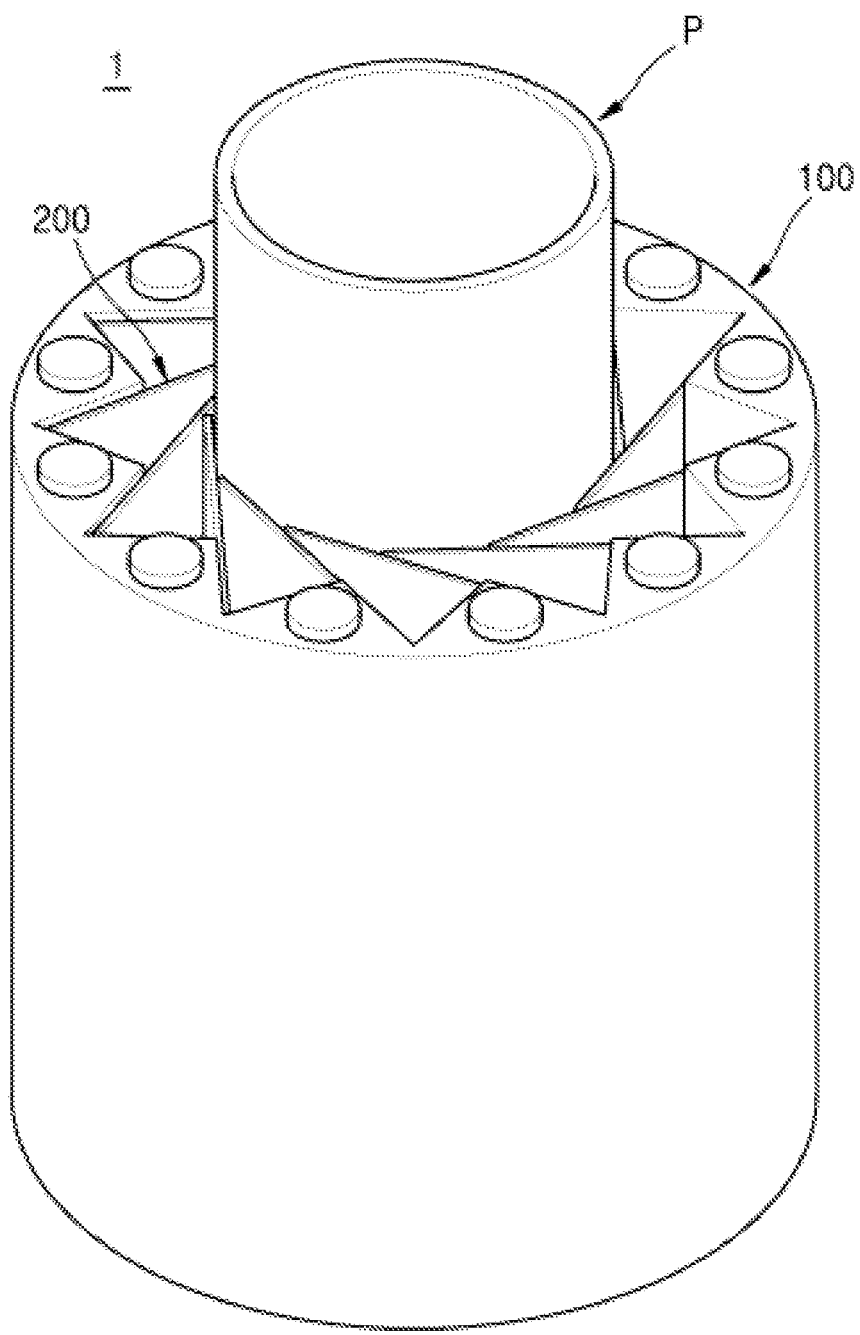
FIG. 3 is an enlarged view illustrating a portion of the flexible thermoelectric module apparatus according to an embodiment of the present invention.

FIGS. 1 to 3 are view illustrating a flexible thermoelectric module apparatus 1 according to an embodiment of the present invention.

A flexible thermoelectric module apparatus 1 according to an embodiment of the present invention includes: a heat sink 100 longitudinally extending; and a thermoelectric module 200 disposed in the heat sink 100, in which the heat sink 100 has a pipe-shaped body 110 constituting a main body and a hole 120 longitudinally formed through the center portion of the body 110, the thermoelectric module 200 has a plurality of thermoelectric plates 210, the thermoelectric plates 210 are plates having predetermined length and width, are arranged longitudinally in parallel with the heat sink 100, with a first side in the width direction connected to the inner side of the body 110 and a second side disposed inside the hole 120, are arranged in parallel with each other at circumferentially predetermined distances from each other in the hole 120, and have a predetermined angle to the radial direction of the heat sink 100 such that they are inclined at a predetermined angle therebetween.

The heat sink 100 functions as a housing of the flexible thermoelectric module apparatus 1 according to an embodiment of the present invention and as a thermal medium. Preferably, the heat sink 100 may be made of material having high thermal conductivity. The heat sink 100 extending in a predetermined longitudinal direction.

The heat sink 100 generally has the shape of a pipe. That is, the heat sink 100 has the pipe-shaped cylindrical body 110 and the hole longitudinally formed through the heat sink 100.

The thermoelectric module 200 is disposed inside the heat sink 100. That is, the thermoelectric module 200 is disposed in the hole 120 of the heat sink 100.

The thermoelectric module 200 has a plurality of thermoelectric plates 210. The thermoelectric plates 210 are formed in the shape of a plate having predetermined length and width, that is, the shape of a predetermined plate. The thermoelectric plates 210 are arranged longitudinally in parallel with the heat sink 100, having predetermined length and width. That is, the thermoelectric plates 210 are arranged in the longitudinal direction of the hole 120. Further, in the width direction, a first side of the thermoelectric plates 210 is connected to the inner side of the body 110 and a second side is positioned in the hole 120. That is, in the width direction, a first side of the thermoelectric plates 210 is in contact with the inner side of the hole 120 of the heat sink 100 and a second side extends inside the hole 120.

The thermoelectric plates 210 are formed by bonding a P-type semiconductor and an N-type semiconductor and made of a material that generates electricity using a temperature difference. That is, when a high-temperature hot side and a low-temperature cold side are formed at both sides in the width direction of the thermoelectric plates 210, electricity is generated in the thermoelectric plates 210.

Figure 4:
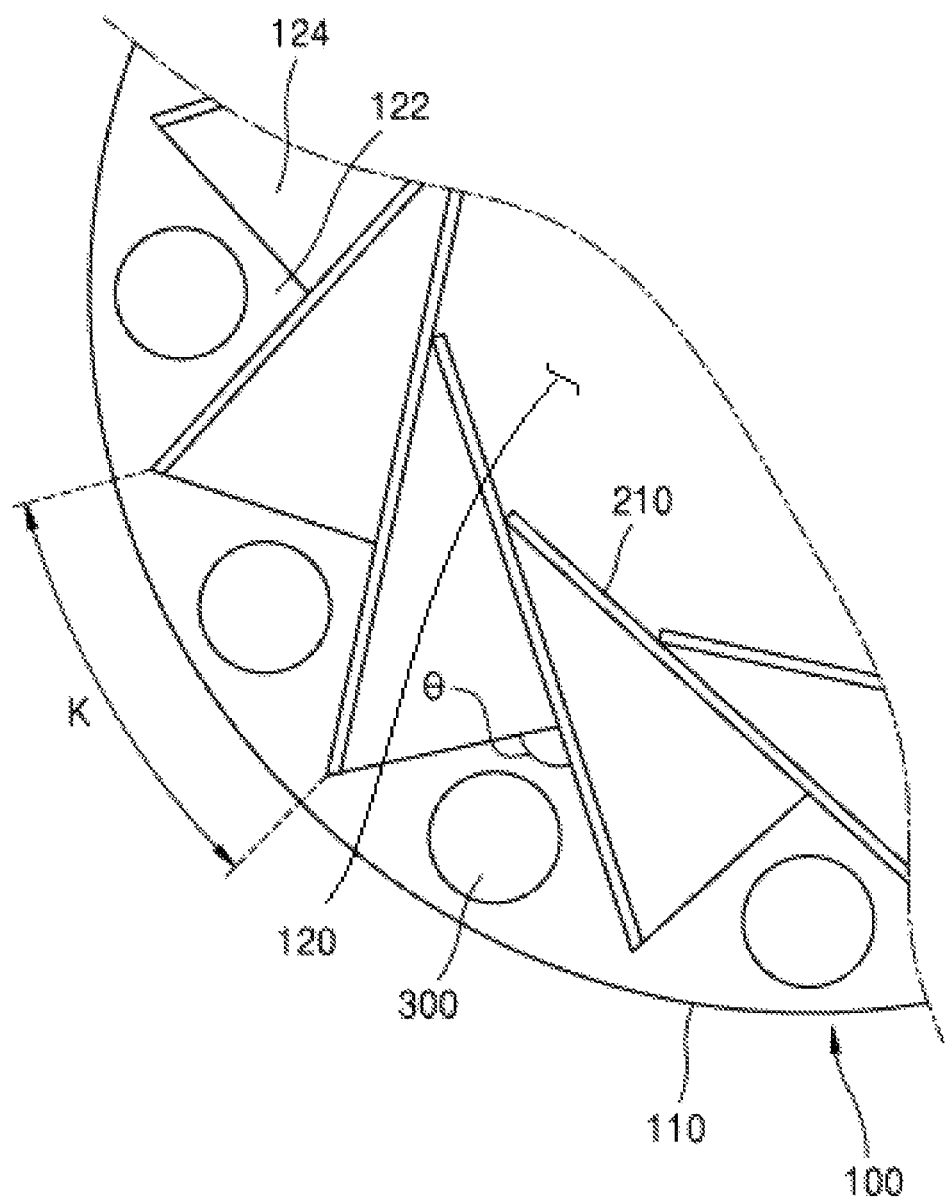
FIG. 4 is a view illustrating the flexible thermoelectric module apparatus according to an embodiment of the present invention disposed in an exhaust pipe of a vehicle.

The thermoelectric plates 210 are arranged in parallel with each other with a predetermined gap circumferentially in the hole 120 and have a predetermined angle to the radial direction of the heat sink 100, so they are inclined with a predetermined angle therebetween. That is, as illustrated in FIG. 4, the thermoelectric plates 210 arranged in parallel with each other circumferentially with a predetermined gap K. Further, the thermoelectric plates 210 extend toward the center of the hole 120 from the inner side of the hole 120, so they extend with the predetermined angle. That is, as in the figures, they are inclined with a predetermined angle to the radial direction of the heat sink 100. Accordingly, the thermoelectric plates 210 are spaced at a predetermined distance from the center of the heat sink 100 and overlap lines dividing the area of the heat sink 100.

Preferably, the body 110 has a plurality of triangular protrusions 120 having a predetermined projection angle and two slopes on the inner side defining the hole 120, the protrusions 120 are repeatedly formed circumferentially in parallel with each other such that corrugations 124 and ridges 122 are alternately formed on the inner side of the body 110, and the thermoelectric plates 210 are disposed in contact with first slopes of the protrusions 120.

That is, as illustrated in FIG. 4, the protrusions 120 are formed on the inner side defining the hole 120, have the shape of a triangle having a predetermined projection angle θ and two slopes with the projection angle therebetween. Further, the protrusions 120 extend in the longitudinal direction of the heat sink 100 and are arranged circumferentially in parallel with each other, so the corrugations 124 and the ridges 122 can be alternately formed on the inner side of the body 110. Further, since first sides in the width direction of the thermoelectric plates 210 are in contact with first sides of the protrusions 120, the thermoelectric plates 210 can be inclined. On the other hand, a plurality of grooves may be formed on the outer side of the heat sink 100, so the surface area is increased and heat can be easily discharged.

Further, coolant pipes 300 through which a coolant flows are provided. The coolant pipes 300 may be disposed through the body 110 of the heat sink 100. The coolant pipes 300, which are parts for maintaining a temperature difference in the width direction of the thermoelectric plates 210, are disposed in the body 110 and allow flow of a coolant such as cold water, so they can maintain the first sides in the width direction of the thermoelectric plates 210 at a low temperature. On the other hand, as illustrated in the figures, the coolant pipes 300 are disposed longitudinally through the body 100 and extend in the longitudinal direction of the heat sink 100 along the ridges 122 formed by the protrusions 120.

According to this configuration, the arrangement of the plurality of thermoelectric plates 210 defines a substantially cylindrical space in the hole 120. That is, preferably, the second sides in the width direction of the thermoelectric plates 210 may be or not in contact with the other thermoelectric plates 210. The second sides in the width direction of the thermoelectric plates 210 define a cylindrical shape through which predetermined exhaust pipes pass.

The thermoelectric plates 210 are positioned around the cylindrical space. Accordingly, as illustrated in FIG. 3, predetermined exhaust pipes may be disposed in the cylindrical space. Further, in the positional relationship between the thermoelectric plates 210 and the exhaust pipes, the thermoelectric plates 210 are not in contact with the cylindrical exhaust pipe in the diameter direction of the cylindrical exhaust pipe, but the thermoelectric plates 210 may be in contact with the cylindrical exhaust pipe in the shape of a tangential line.

Preferably, the thermoelectric plates 210 are made of a flexible material to be able to bend. On the other hand, preferably, the radius of curvature when the thermoelectric plates 210 bend may be 1 mm to 10 mm. Preferably, the thermoelectric plates 210 include a thermoelectric element coated with (for example, polyimide, poly(ether ether keton), Poly(ether sulfone), and Poly(phenylene sulfide)) having thermal resistance by which glass temperature Tg can resist exhaust pipe temperature, and a thermoelectric material of n-type and p-type semiconductors that are used as flexible thermoelectric element may include an element coated with a heat-resistant polymer and having a radius of curvature of 1 mm to 10 mm.

In the flexible thermoelectric module apparatus 1 according to an embodiment of the present invention having the configuration described above, a temperature difference between the hot side and the cold side of the thermoelectric plate 210 having the function of a flexible thermoelectric element can maximally spread within a limited space.

A large temperature different should be maintained to increase efficiency of a thermoelectric module. To this end, other than increasing the temperature difference between the hot side and the cold side, it may be possible to prevent thermal equilibrium by the heat of the hot side transferring to the cold side by appropriately spacing the hot side and the cold side.

That is, a first end of the thermoelectric plate 210 functioning as the hot side is in contact with a predetermined exhaust pipe not in the diameter direction, but in a tangential direction, and a second end is in contact with the heat sink 100 in the tangential direction, so the distance between the hot side and the cold side increases, and accordingly, the temperature difference between the hot side and the cold side is maximally secured and temperature gradient can be clear. Further, since the coolant pipes 300 are disposed in the heat sink 100 close to the cold side, the temperature difference between the cold side and the hot side may further spread. Accordingly, the efficiency of generating electricity using the temperature difference can be maximized and the rate of electric generation in a small space can be improved.

Further, in the flexible thermoelectric module apparatus 1 according to an embodiment of the present invention, the thermoelectric plates 210 of the thermoelectric modules 200 have flexibility. Thermoelectric modules made of an alloy and ceramic in the related art have high brittleness, so they may be damaged due to external shock and vibration of an internal combustion engine, as time passes. However, since the flexible thermoelectric plates 210 are provided in the present invention, this defect is prevented, and the thermoelectric plates 210 can easily cover the exhaust pipe of an internal combustion engine, so it is possible to easily absorb external shock and vibration of the internal combustion engine. Further, for the flexible thermoelectric modules 200, a carbon-based organic material having low density in comparison to alloys and ceramic are generally used due to the characteristics of the material, so the thermoelectric modules may be relatively light.

In addition, in the flexible thermoelectric module apparatus 1 according to an embodiment of the present invention, since the flexible thermoelectric modules 200 are disposed in the heat sink 100, the apparatus can be easily added to or removed from the exhaust pipes of the internal combustion engines of the related art. That is, since the thermoelectric modules 200 are soft and an exhaust pipe can be easily inserted, the apparatus can be operated only by being installed on an exhaust pipe. Accordingly, the apparatus can be applied to all of new internal combustion engines, other than the internal combustion engines of the related art, so it can be more widely used.

Figure 5:
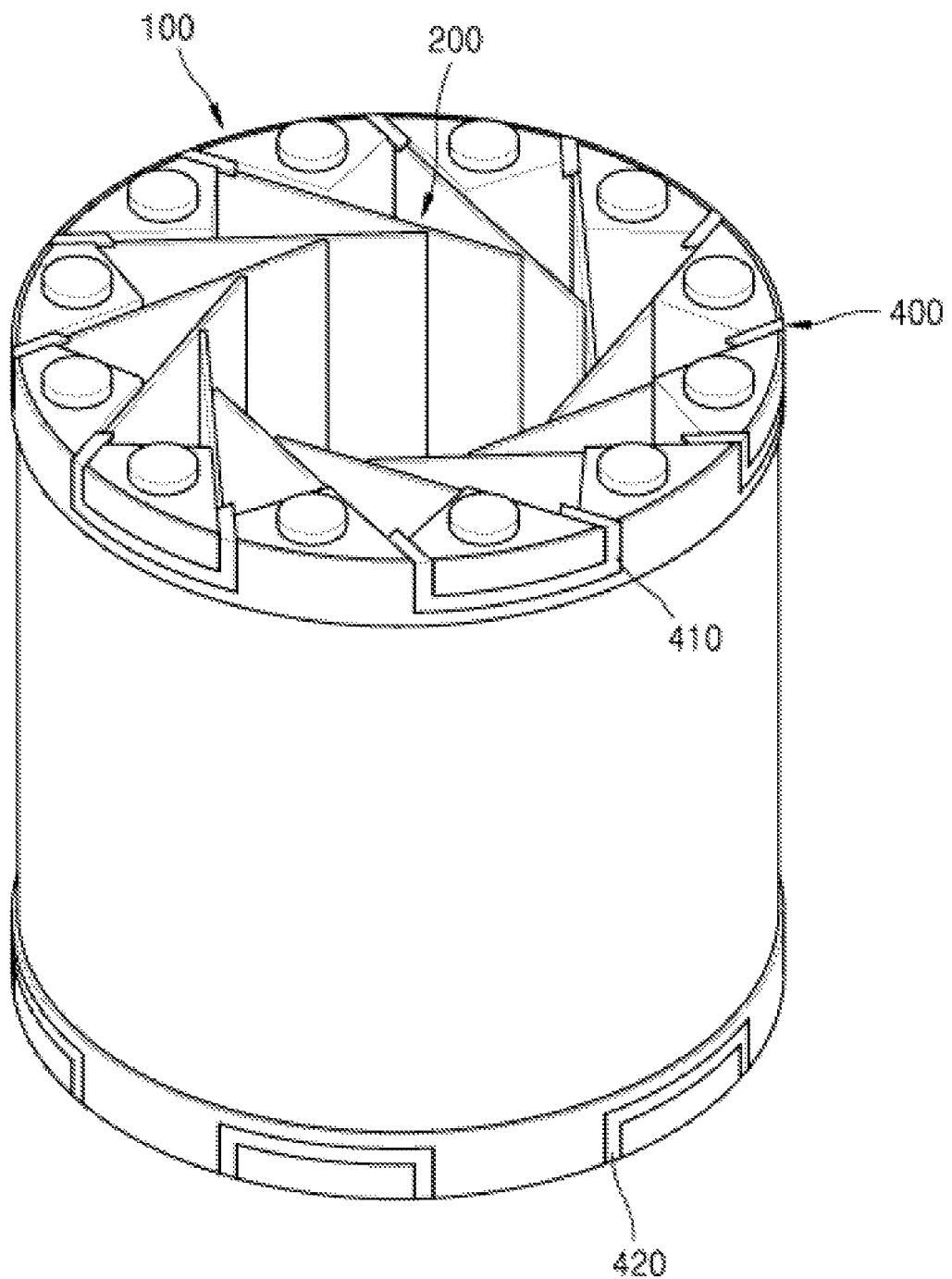
FIG. 5 is a view illustrating a flexible thermoelectric module apparatus according to an embodiment of the present invention.
Figure 6:
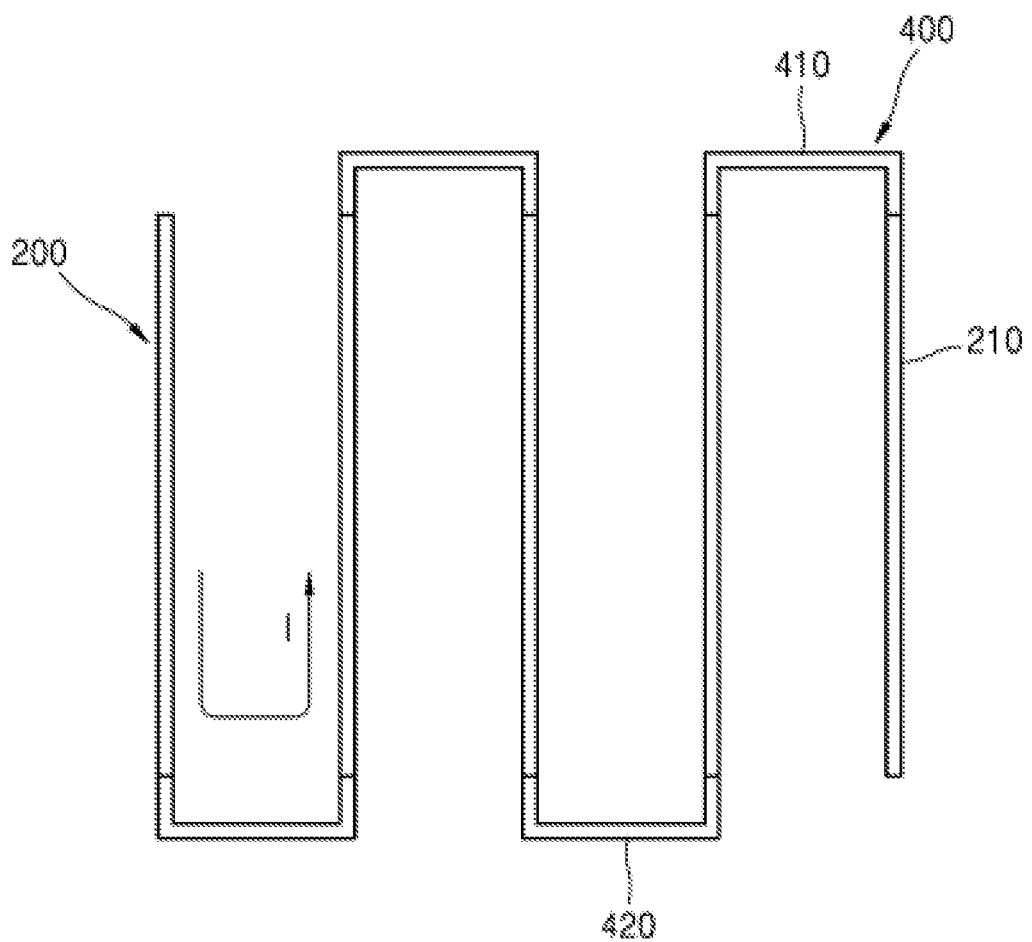
FIG. 6 is a view illustrating connection between a thermoelectric module and a connecting terminal of a flexible thermoelectric module apparatus according to an embodiment of the present invention.

FIG. 5 is a view illustrating a flexible thermoelectric module apparatus 1 according to an embodiment of the present invention and FIG. 6 is a view illustrating connection between a thermoelectric module 200 and a connecting terminal 400 in the flexible thermoelectric module apparatus 1 according to an embodiment of the present invention.

Preferably, the flexible thermoelectric module apparatus 1 according to an embodiment of the present invention further include a plurality of connecting terminals 400, in which the connecting terminals 400 are disposed between the thermoelectric plates 210 respectively and connect the thermoelectric plates 210 in series.

That is, as illustrated in FIG. 5, predetermined connecting terminals 400 are provided, disposed between the thermoelectric plates 210, and connect the thermoelectric plates 210 in series. That is, sequential connection of thermoelectric plate 210-connecting terminal 400-thermoelectric plate 210-connecting terminal 400 can be achieved.

In this case, preferably, the connecting terminals 400 extend along the outer side of the heat sink 100, partially bend, and are connected to both ends of the thermoelectric plates 210. That is, as illustrated in FIG. 5, the connecting terminal 400 may be partially bent and connected to the thermoelectric plate 210 at both ends, in which the center portion of the connecting terminal 400 may extend along the outer side of the heat sink 100.

Preferably, as illustrated in FIG. 6, the connecting terminals 400 include a plurality of first connecting terminals 410 connected to both longitudinal ends of the thermoelectric plates 210 and a plurality of second connecting terminals 420. The first connecting terminals 410 connect first ends of two adjacent thermoelectric plates 210 and the second connecting terminal 420 connect second ends of two adjacent thermoelectric plates 210, so the first connecting terminal 410 and the second connecting terminal 420 are connected to both ends of any one thermoelectric plate 210 and are each connected to another thermoelectric plate 210, and accordingly, the thermoelectric plates 210 can be connected in series. The longitudinal direction, as described above, means the forming direction of the hole 120 and the extension direction of the heat sink 100. According to this configuration, a current can flow in the direction I in FIG. 6.

As described above, since the thermoelectric plates 210 are connected in series by the connecting terminals 400, high yield of power can be achieved. On the other hand, in this case, predetermined electric input terminal and output terminal may be provided, but the present invention is not limited thereto.

Figure 7:
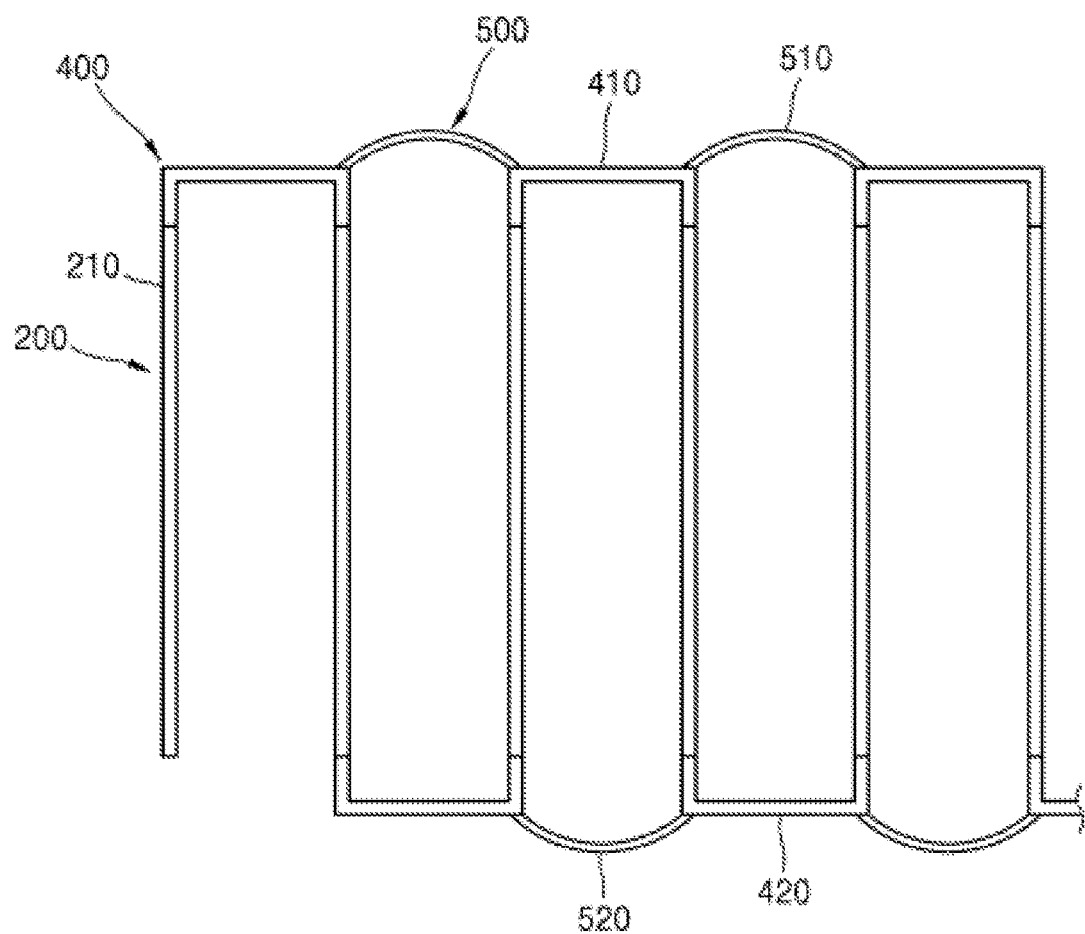
FIG. 7 is a view illustrating connection between a thermoelectric module, a connection terminal, and a moving terminal of a flexible thermoelectric module apparatus according to an embodiment of the present invention.
Figure 8:
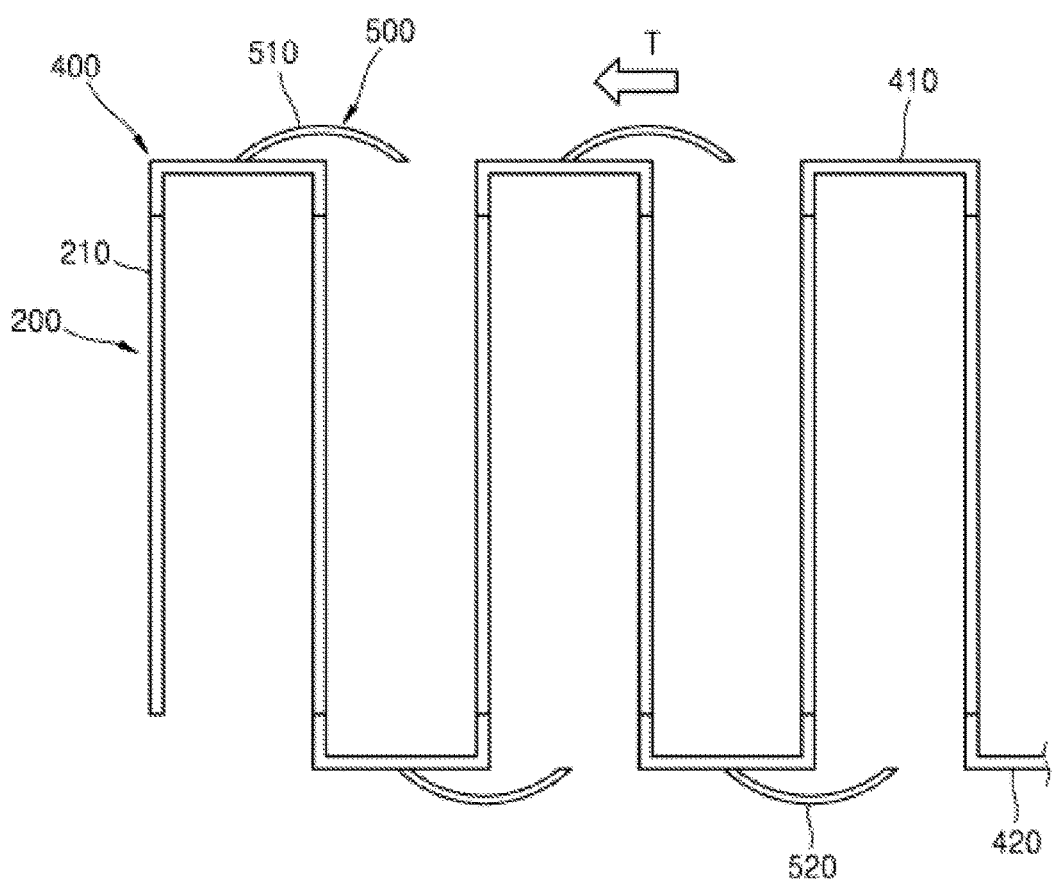
FIG. 8 is a view illustrating connection between a thermoelectric module, a connection terminal, and a moving terminal of a flexible thermoelectric module apparatus according to an embodiment of the present invention.
Figure 9:
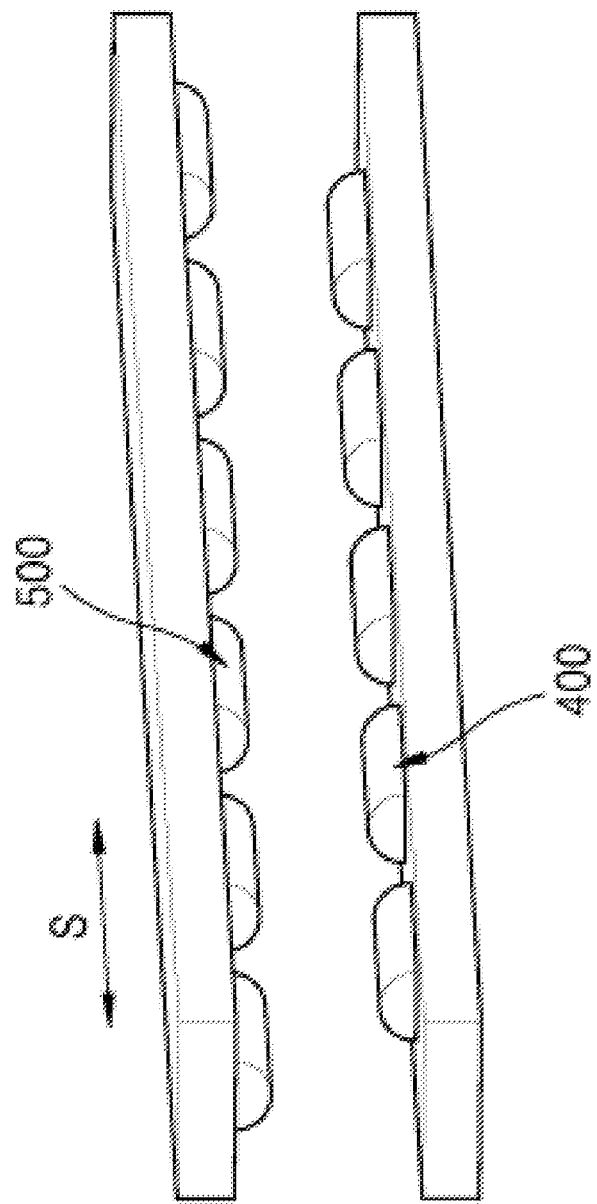
FIG. 9 is a view illustrating connection between a connecting terminal and a moving terminal of a flexible thermoelectric module apparatus according to an embodiment of the present invention.
Figure 10:
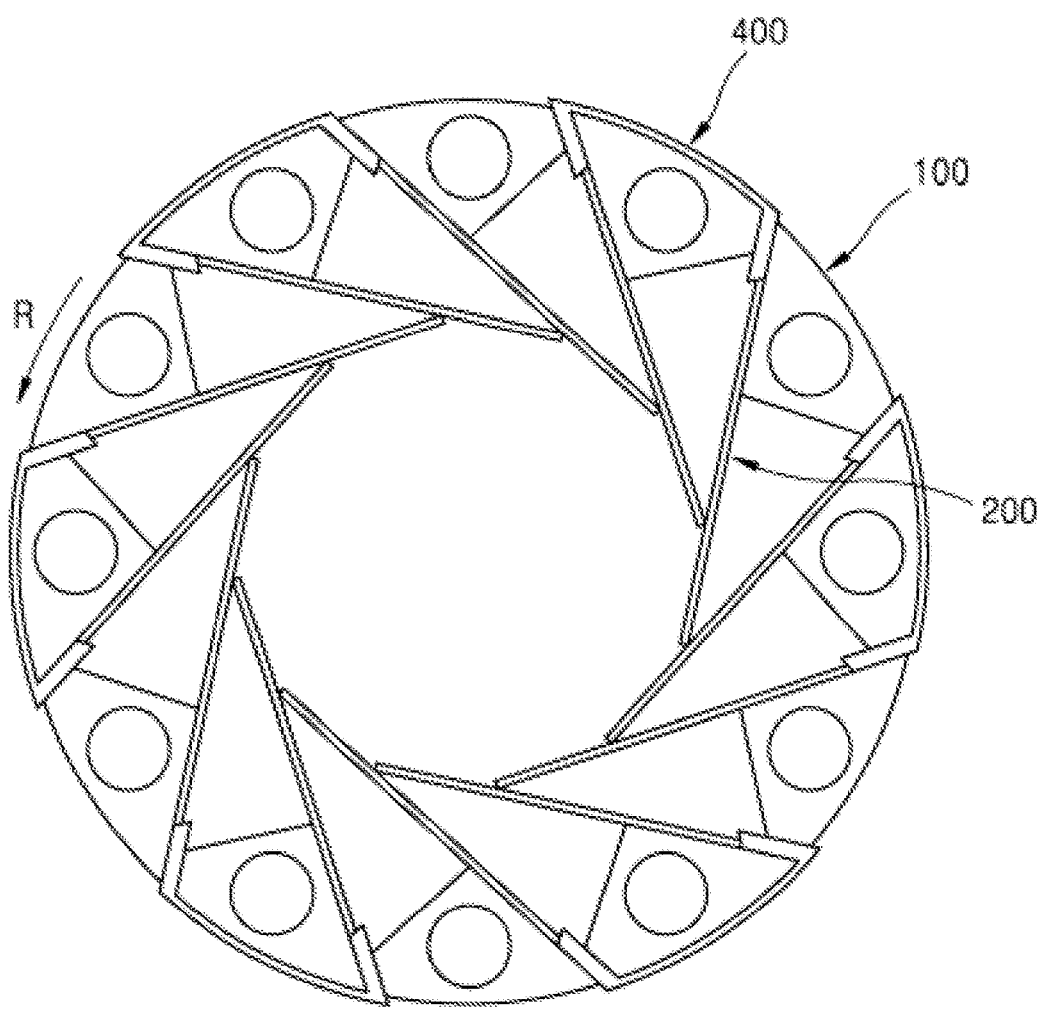
FIG. 10 is a view illustrating connection between a connecting terminal and a moving terminal of a flexible thermoelectric module apparatus according to an embodiment of the present invention.
Figure 11:
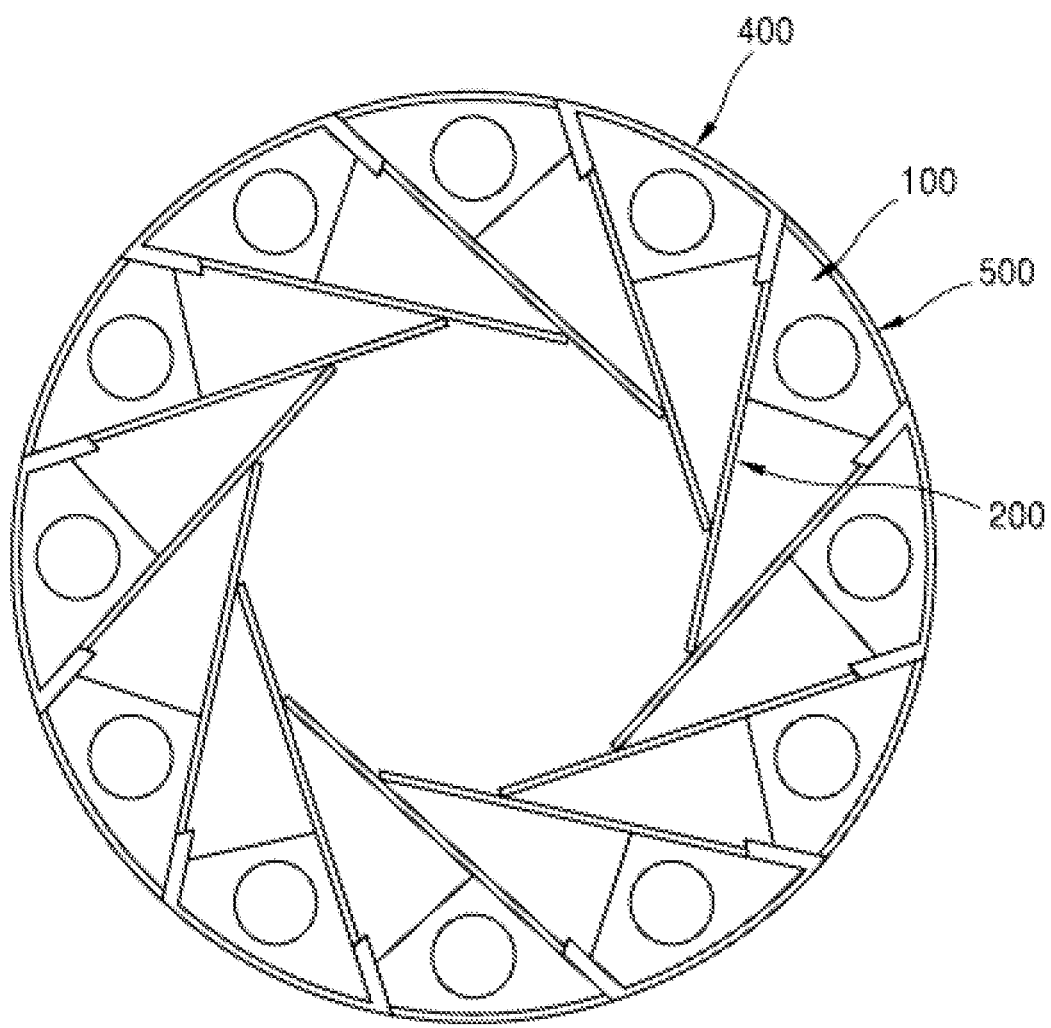
FIG. 11 is a view illustrating connection between a connecting terminal and a moving terminal of a flexible thermoelectric module apparatus according to an embodiment of the present invention.

FIGS. 7 and 8 are view illustrating connection between thermoelectric module 200, moving terminals 500, connecting terminals 400 in a flexible thermoelectric module apparatus 1 according to an embodiment of the present invention and FIGS. 9 to 11 are views illustrating connection between connecting terminals 400 and moving terminals 500 in the flexible thermoelectric module apparatus 1 according to an embodiment of the present invention.

Preferably, the flexible thermoelectric module apparatus 1 according to an embodiment of the present invention further includes a plurality of moving terminals 500 that change positions. The moving terminals 500 connect the thermoelectric plates 500 in parallel by connecting the connecting terminals 400, but they can change the positions, so they can connect or disconnect the connecting terminals 400.

The moving terminals 500 connect the connecting terminals 400. Accordingly, as illustrated in FIG. 7, the thermoelectric plates 210 can be connected in parallel.

Preferably, the moving terminals 500 include a plurality of first moving terminals 510 connected to both ends of the thermoelectric plates 210 and a plurality of second moving terminals 520. The first moving terminals 510 connect the first connecting terminals 410 and the second moving terminals 520 connect the second connecting terminals 420, so the thermoelectric plates 210 are connected in parallel.

In this case, the moving terminals 500 can connect or disconnect the connecting terminals 400 by moving in a predetermined direction of an arrow T, as illustrated in FIGS. 7 and 8. Accordingly, when the moving terminals 500 and the connecting terminals 400 are connected, a parallel connection mode of the thermoelectric plates 210 is achieved, and when the moving terminals 500 and the connecting terminals 400 are disconnected, a series connection mode of the thermoelectric plates 210 is achieved. That is, as illustrated in FIG. 9, a plurality of moving terminals 500 and a plurality of connecting terminals 400 are provided, and the moving terminals 500 can connect or disconnect the connecting terminals 400 by changing in the direction of an arrow S.

Preferably, the moving terminals 500 have a parallel connection mode that connects adjacent connecting terminals 400 and a series connection mode that disconnects adjacent connecting terminals 400, by moving along the outer side of the heat sink 100. That is, as illustrated in FIGS. 10 and 11, the connecting terminals 400 and the moving terminals 500 are disposed along the outer side of the heat sink 100 and the moving terminals 500 can connect or disconnect the connecting terminals 400 by moving along the outer side of the heat sink 100.

According to this configuration, the thermoelectric modules 200 can be selectively connected in parallel and in series. That is, series connection can provide high power, while parallel connection can continuously generate and supply power even if the thermoelectric plates 210 and the thermoelectric modules 200 are partially damaged.

Figure 12:
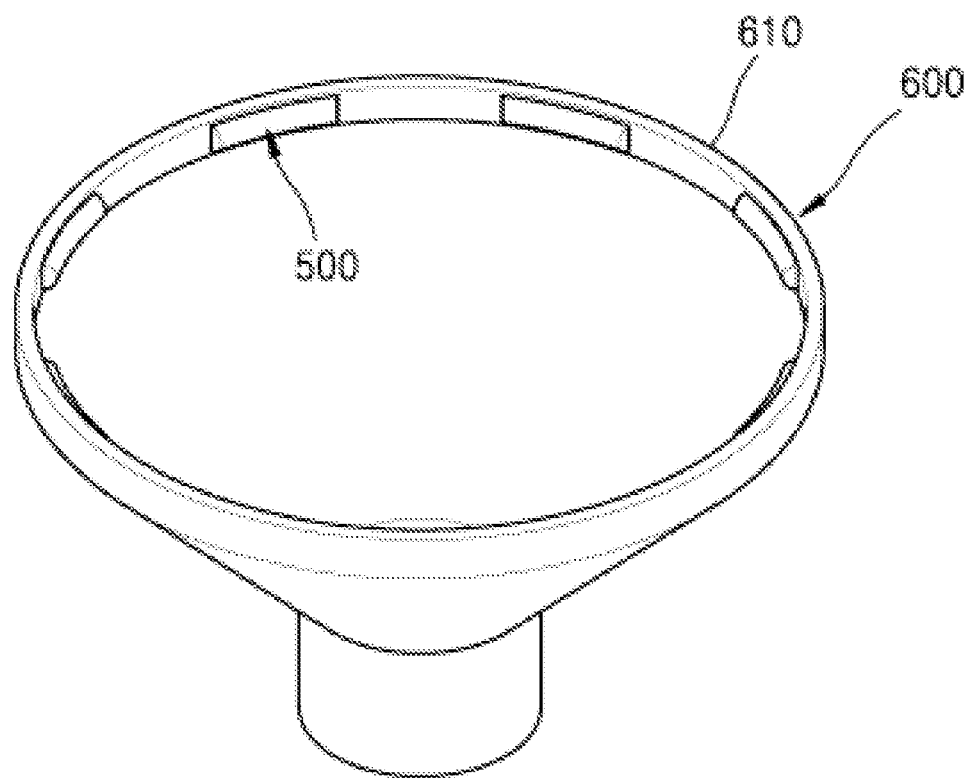
FIG. 12 is a view illustrating a cap of a flexible thermoelectric module apparatus according to an embodiment of the present invention.
Figure 13:
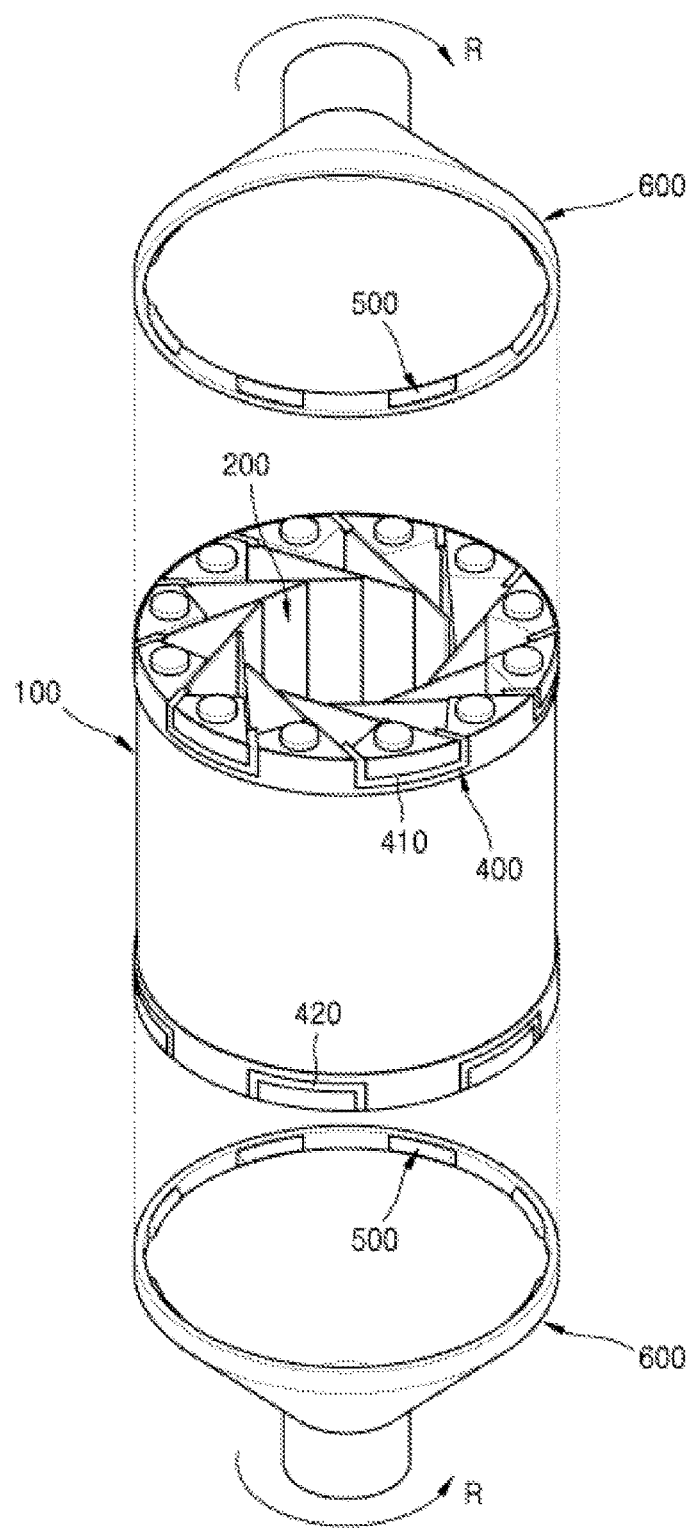
FIG. 13 is a view illustrating connection between caps and a heat sink of a flexible thermoelectric module apparatus according to an embodiment of the present invention.
Figure 14:
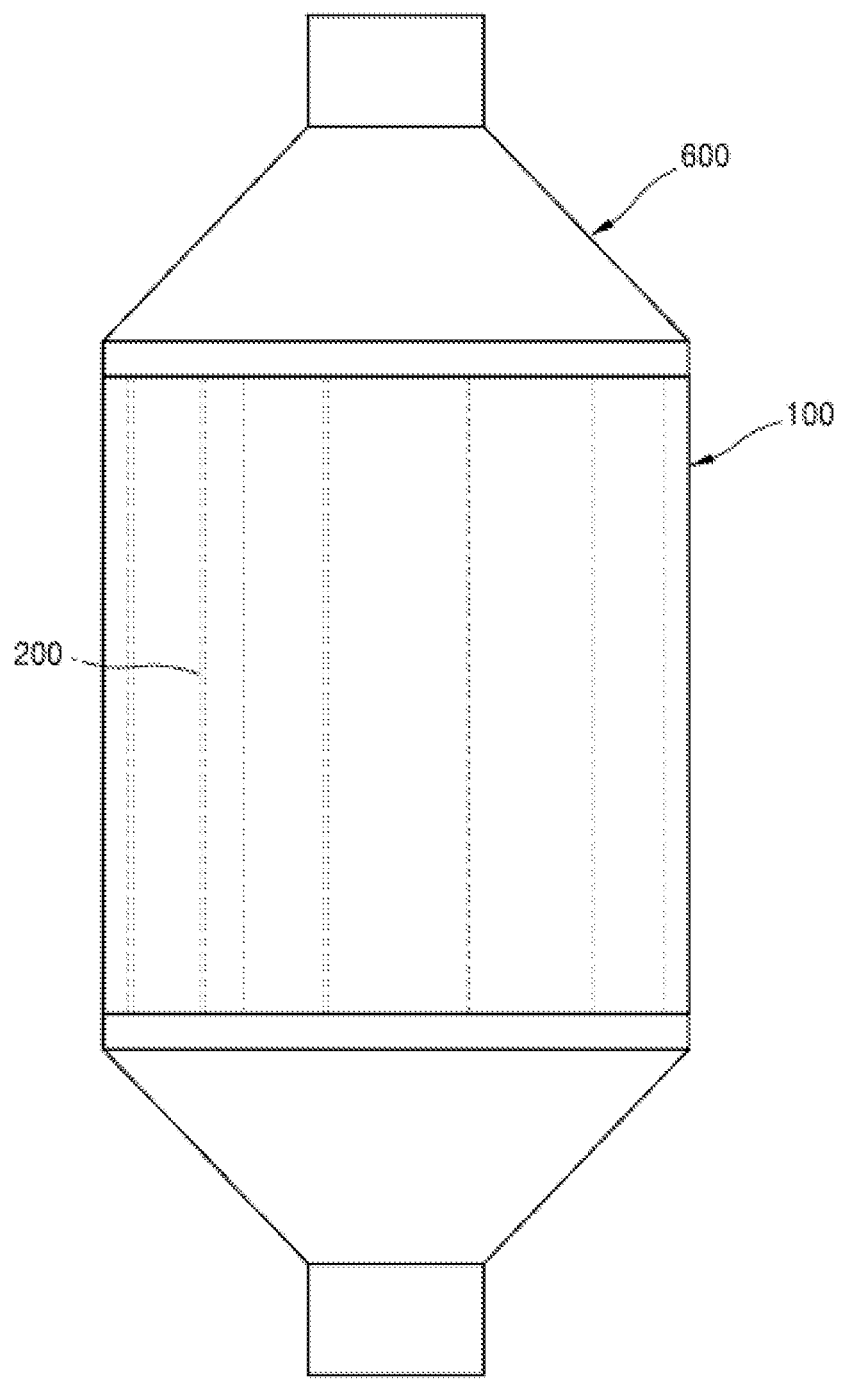
FIG. 14 is a view illustrating a flexible thermoelectric module apparatus according to an embodiment of the present invention.

FIG. 12 is a view illustrating a cap 600 of a flexible thermoelectric module apparatus 1 according to an embodiment of the present invention, FIG. 13 is a view illustrating connection between the caps 600 and a heat sink 100 of a flexible thermoelectric module apparatus 1 according to an embodiment of the present invention, FIG. 14 is a view illustrating a flexible thermoelectric module apparatus 1 according to an embodiment of the present invention.

Preferably, the flexible thermoelectric module apparatus 1 according to an embodiment of the present invention further include caps 600 coupled to both ends of the heat sink 100 and the caps 600 are detachably attached to the heat sink 100.

The caps 600, which are coupled to both ends of the heat sink 100, may be predetermined rubber caps. The caps 600 may have a coupling portion 610 formed in a predetermined ring shape corresponding to the longitudinal ends of the heat sink 100.

On the other hand, the caps 600 may be made of various materials such as rubber and metal and is not limited to these materials. The caps 600 may have rigidity that can resist vibration of an exhaust pipe or vibration of a machine and they can be brought in direct contact with an exhaust pipe, so they may be made of heat-resistant materials. Further, the caps 600 can support the thermoelectric plates 210 of the thermoelectric modules 200 covering an exhaust pipe. Further, this configuration is also not limited to that illustrated in the figures.

Preferably, the cap 600 can be turned in the circumferential direction of the heat sink 100 and the moving terminals 500 are disposed inside the cap 500, so when the cap 600 is turned, the moving terminals 500 move and change the parallel mode and the series mode.

That is, as described above, electric connection of the connecting terminals 400 is determined by the moving terminals 500 moving with respect to the connecting terminals 400, the moving terminals 500 are disposed inside the cap 600 and move with turning of the cap 600, so connection between the connecting terminals 400 is determined. In this case, the cap 600 is turned in the direction of an arrow R in FIG. 13, and accordingly, the moving terminals 500 can move and connect the connecting terminals 400.

According to this configuration, the parallel connection mode and the series connection mode can be simply changed, so efficiency of generating power can be improved.

Figure 15:
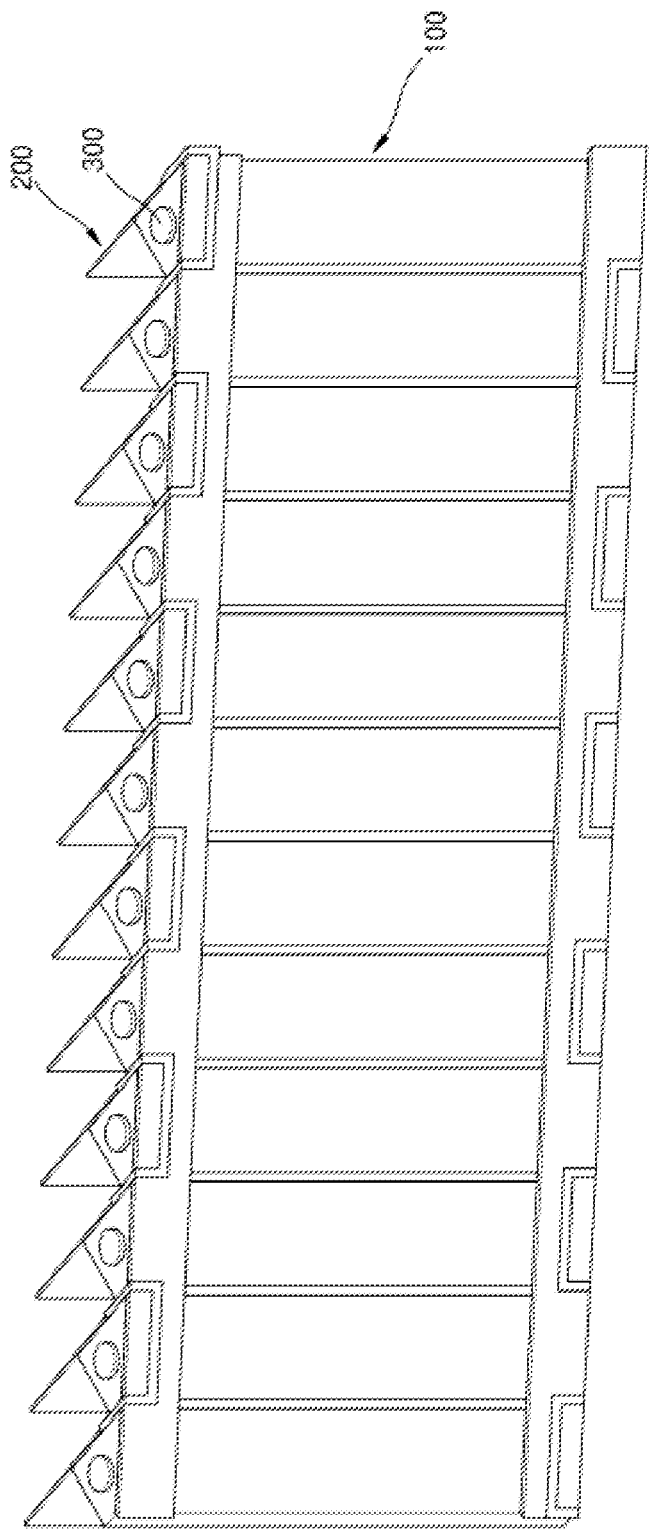
FIG. 15 is a development view illustrating a flexible thermoelectric module apparatus according to an embodiment of the present invention.
Figure 16:
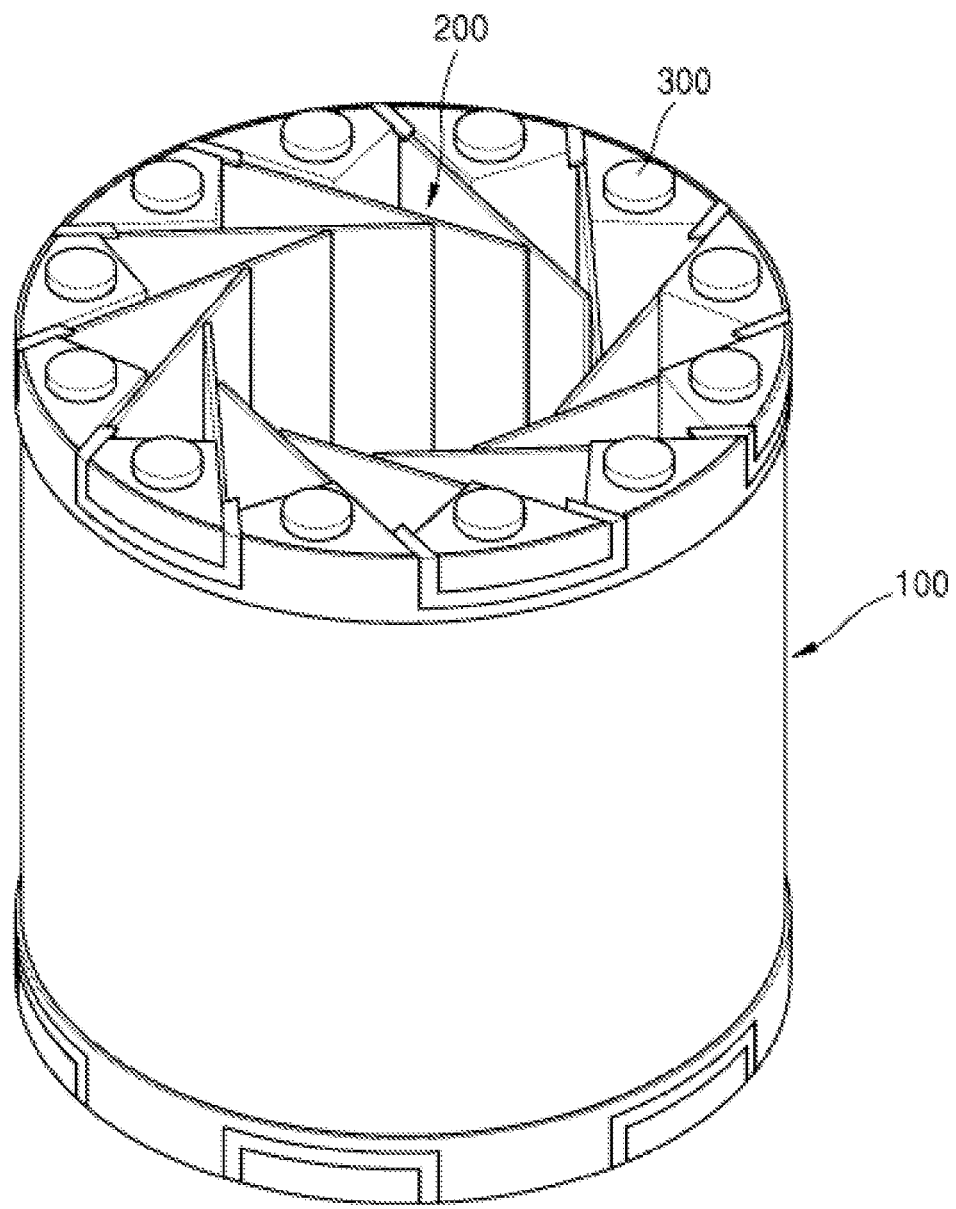
FIG. 16 is a view illustrating a flexible thermoelectric module apparatus according to an embodiment of the present invention.
Figure 17:
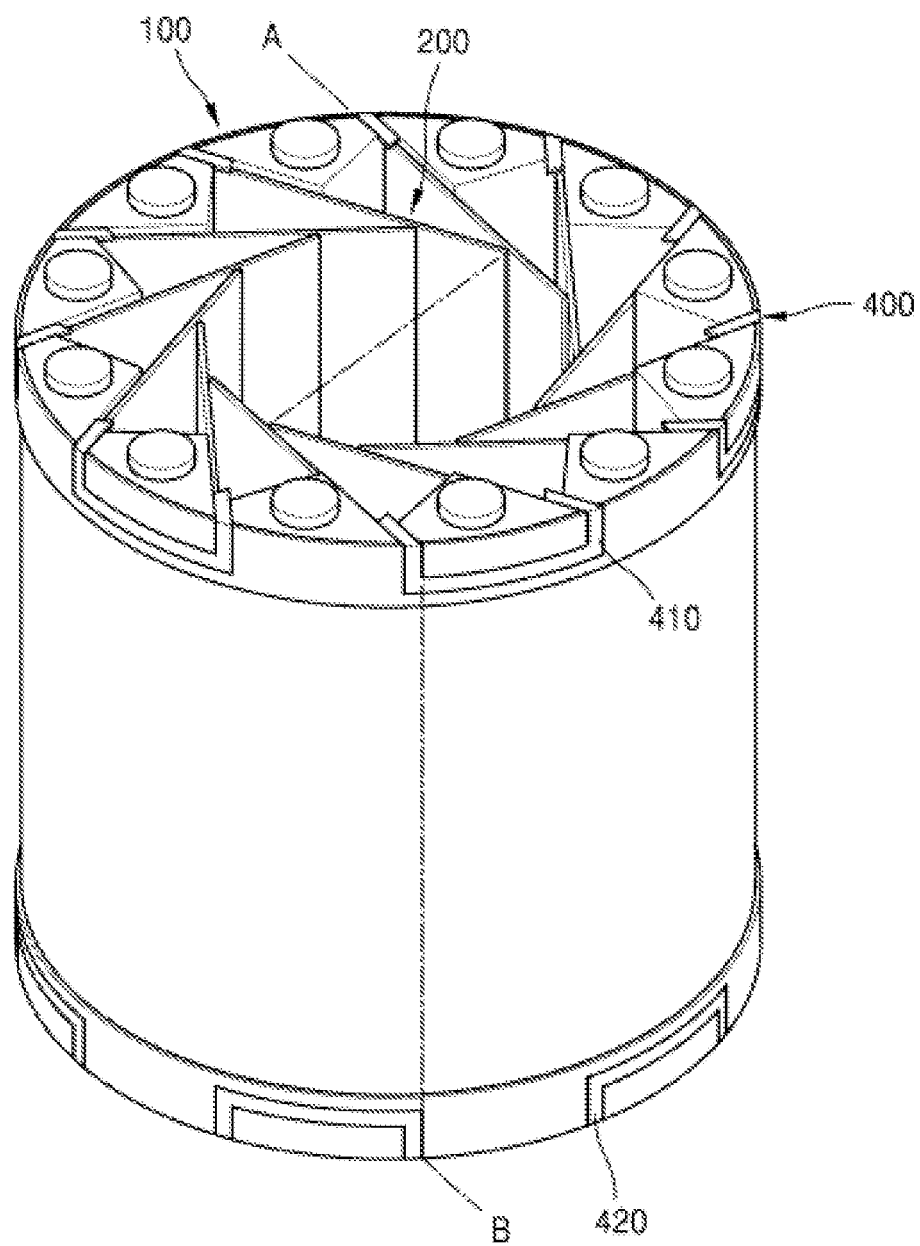
FIG. 17 is a view illustrating the structure of a flexible thermoelectric module apparatus according to an embodiment of the present invention.
Figure 18:
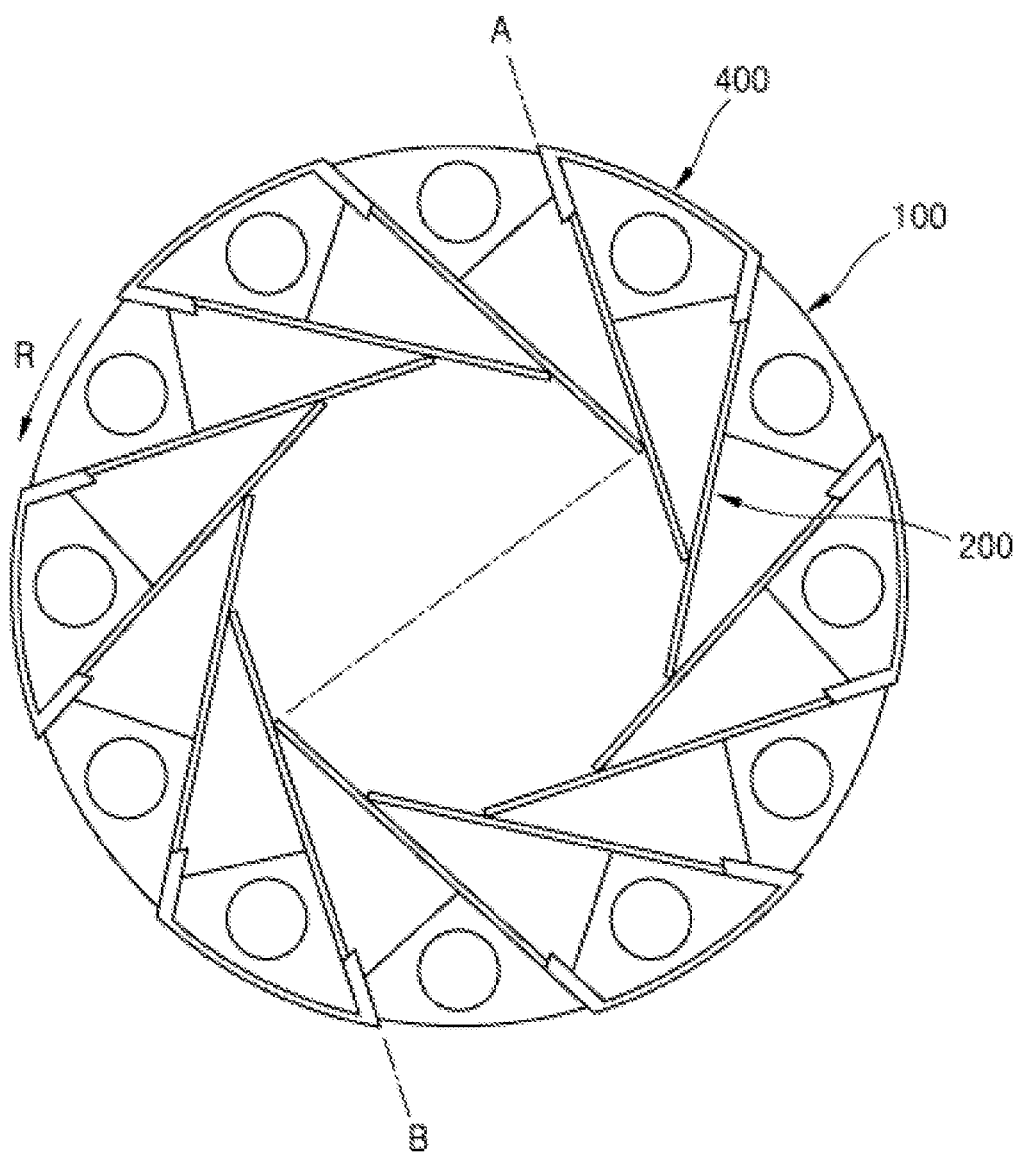
FIG. 18 is a view illustrating the structure of a flexible thermoelectric module apparatus according to an embodiment of the present invention.

FIG. 15 is a development view illustrating the flexible thermoelectric module apparatus 1 according to an embodiment of the present invention and FIG. 16 is a view illustrating the flexible thermoelectric module apparatus 1 according to an embodiment of the present invention. FIGS. 17 and 18 are views illustrating the structure of the flexible thermoelectric module apparatus 1 according to an embodiment of the present invention.

The heat sink 100 of the flexible thermoelectric module apparatus 1 according to an embodiment of the present invention illustrated in FIG. 15 may be made of a flexible material. On the other hand, the heat sink 100 may be laterally divided by separation lines that are longitudinally formed and developed in one plate, and the cylindrical heat sink 100 and the cylindrical flexible thermoelectric module apparatus 1 can be achieved, as illustrated in FIG. 16, by rolling the heat sink and connecting the lateral ends. That is, the heat sink 100 has a configuration of one plate and flexibility, so a cylindrical configuration is achieved by rolling the heat sink and connecting the lateral ends. In this case, the thermoelectric plates 200 coupled to the heat sink 100 may be arranged diagonally with respect to the area direction of the heat sink 100. On the other hand, predetermined coupling members may be provided to connect both lateral ends of the heat sink 100 and the coupling members may be, for example, locking devices such as clips or hooks. According to this configuration, the heat sink can be easily mounted on a predetermined pipe. That is, the heat sink 100 can be simply installed by developing the heat sink 100 outside a pipe, rolling the heat sink 100 around the pipe, and then coupling the ends.

FIGS. 17 and 18 are views illustrating the structure of the flexible thermoelectric module apparatus 1 according to an embodiment of the present invention. Referring to FIGS. 17 and 18, the heat sink 100 of the flexible thermoelectric module apparatus 1 according to an embodiment of the present invention can be divided along the dashed line A-B. That is, the cylindrical heat sink can be divided into two half cylinders along the line A-B, so two longitudinal separation lines may be provided. In this case, one of the divided parts is a connecting part and may be provided with a connecting device such as a hinge for rotatably connecting the two parts, and the other one is an open part and may be provided with a predetermined locking device for fixing the divided parts. Accordingly, the heat sink 100 can be opened/closed by turning around one part.

According to this configuration, it can be easily mounted on a predetermined pipe. That is, it can be simply mounted on a pipe by opening the open part, placing a pipe inside the open part, and closing and fixing the open part.

Although exemplary embodiments of the present invention were illustrated and described above, the present invention is not limited to the specific exemplary embodiments and may be modified in various ways by those skilled in the art without departing from the scope of the present invention described in claims, and the modified examples should not be construed independently from the spirit or the scope of the present invention.

As set forth above, according to the flexible thermoelectric module apparatus of the present invention, a temperature difference between a hot side and a cold side of a thermoelectric plate having a function can maximally spread within a limited space.

That is, a first end of the thermoelectric plate functioning as the hot side is in contact with a predetermined exhaust pipe not in the diameter direction, but in a tangential direction, and a second end is in contact with the heat sink in the tangential direction, so the distance between the hot side and the cold side increases, and accordingly, the temperature difference between the hot side and the cold side is maximally secured and temperature gradient can be clear. Further, since the coolant pipes are disposed in the heat sink close to the cold side, the temperature difference between the cold side and the hot side may further spread. Accordingly, the efficiency of generating electricity using the temperature difference can be maximized and the rate of electric generation in a small space can be improved.

On the other hand, the space where the thermoelectric plates are disposed may contain air, or may be under low pressure or under a vacuum state, so the temperature gradient at both ends of the thermoelectric plates is clear and efficiency of generating power can be improved.

Further, according to the flexible thermoelectric module apparatus of the present invention, the thermoelectric plates of the thermoelectric modules have flexibility. Thermoelectric modules made of an alloy and ceramic in the related art has high brittleness, so they may be damaged due to external shock and vibration of an internal combustion engine, as time passes. However, since the flexible thermoelectric plates are provided in the present invention, this defect is prevented, and the thermoelectric plates can easily cover the exhaust pipe of an internal combustion engine, so it is possible to easily absorb external shock and vibration of the internal combustion engine. Further, for the flexible thermoelectric modules, a carbon-based organic material having low density in comparison to alloys and ceramic are generally used due to the characteristics of the material, so the thermoelectric modules may be relatively light.

In addition, in the flexible thermoelectric module apparatus according to an embodiment of the present invention, since the flexible thermoelectric modules are disposed in the heat sink, the apparatus can be easily added to or removed from the exhaust pipes of the internal combustion engines of the related art. That is, since the thermoelectric modules are soft and an exhaust pipe can be easily inserted, they can be operated only by being installed on an exhaust pipe. Accordingly, the apparatus can be applied to all of new internal combustion engines, other than the internal combustion engines of the related art, so it can be more widely used.

Further, according to flexible thermoelectric module apparatus of the present invention, since the thermoelectric plates are connected in series by the connecting terminals, high yield of power can be achieved.

Further, according to flexible thermoelectric module apparatus of the present invention, moving terminals for connecting the connecting terminals are provided, the thermoelectric modules can be selectively connected in parallel and in series. That is, series connection can provide high power, while parallel connection can continuously generate and supply power even if the thermoelectric plates and the thermoelectric modules are partially damaged.

Further, the flexible thermoelectric module apparatus according to an embodiment of the present invention includes caps coupled to longitudinal ends of the heat sink, the caps can turn about the heat sink, and the moving terminals are disposed inside the caps, so the parallel connection mode and the series connection mode can be easily changed, and accordingly, efficiency of generating power can be improved.

While the present invention has been illustrated and described in connection with the exemplary embodiments, it will be apparent to those skilled in the art that modifications and variations can be made without departing from the spirit and scope of the invention as defined by the appended claims.

What is claimed is:

1. A flexible thermoelectric module apparatus comprising:
a heat sink extending in a longitudinal direction; and
a thermoelectric module disposed in the heat sink,
wherein the heat sink has a pipe-shape with a body and a hole extending in the longitudinal direction through the center portion of the body,
wherein the body has a plurality of triangular protrusions each having a first linear side and a second linear side that meet to form a predetermined projection angle,
wherein the triangular protrusions are circumferentially repeatedly formed on the inner side of the body such that the triangular protrusions define the hole,
wherein the thermoelectric module has a plurality of thermoelectric plates arranged in the hole along the longitudinal direction in parallel with the longitudinal direction of the heat sink,
wherein each thermoelectric plate has a first side and a second side opposite to each other in a width direction of each thermoelectric plate, and
wherein the width direction of each thermoelectric plate is inclined with respect to a radial direction of the body,
wherein the first side of each thermoelectric plate is in direct physical contact with the respective first linear side of the respective triangular protrusion of the body and the second side of each thermoelectric plate is in direct physical contact with the first side of a single adjacent thermoelectric plate of the plurality of thermoelectric plates,
wherein the first sides of the thermoelectric plates are spaced apart from each other, and
wherein the second sides of the thermoelectric plates within the hole define a circumferential surface of a space in which a cylindrical exhaust pipe is disposed.

2. The apparatus of claim 1, wherein an end of an n-type semiconductor is disposed at the first side of each thermoelectric plate and an end of a p-type semiconductor is disposed at the second side of each thermoelectric plate.

3. The apparatus of claim 1, wherein each thermoelectric plate is made of a flexible material and is bendable.

4. The apparatus of claim 1, wherein each thermoelectric plate has flexibility and a radius of curvature of 1 mm to 10 mm.

5. The apparatus of claim 1, further comprising coolant pipes in which a coolant flows, and wherein the coolant pipes are disposed through the body of the heat sink.

6. The apparatus of claim 5, wherein the coolant pipes extend in the longitudinal direction of the heat sink through the triangular protrusions.

7. The apparatus of claim 1, further comprising a plurality of connecting terminals, wherein each connecting terminal is disposed between adjacent thermoelectric plates of the plurality of thermoelectric plates and each connecting terminal is in direct physical contact with the adjacent thermoelectric plates such that the thermoelectric plates are connected in series.

8. The apparatus of claim 7, wherein the connecting terminals extend along the outer side of the heat sink and bend to connect to the thermoelectric plates.

9. The apparatus of claim 8, wherein the connecting terminals include a plurality of first connecting terminals and a plurality of second connecting terminals,
wherein the first connecting terminals are in direct physical contact with first ends of adjacent thermoelectric plates,
wherein the second connecting terminals are in direct physical contact with second ends of adjacent thermoelectric plates.

10. The apparatus of claim 9, further comprising a plurality of moving terminals that change positions,
wherein the moving terminals connect the thermoelectric plates in parallel by connecting the connecting terminals, and connect or disconnect the connecting terminals by changing positions, and
wherein each moving terminal is in direct physical contact with two adjacent connecting terminals when the moving terminals connect the thermoelectric plates in parallel.

11. The apparatus of claim 10, wherein the moving terminals include a plurality of first moving terminals and a plurality of second moving terminals, and
wherein each first moving terminal is in direct physical contact with two adjacent first connecting terminals and each second moving terminal is in direct physical contact with two adjacent second connecting terminals when the thermoelectric plates are connected in parallel.

12. The apparatus of claim 10, wherein the moving terminals have a parallel connection mode that connects adjacent connecting terminals to each other and a series connection mode that disconnects adjacent connecting terminals from each other, by moving along the outer side of the heat sink.

13. The apparatus of claim 12, further comprising caps coupled to both longitudinal ends of the heat sink, wherein the caps are detachably coupled to the heat sink.

14. The apparatus of claim 13, wherein the caps are disposed rotatably in the circumferential direction of the heat sink, and
wherein the moving terminals are disposed inside the caps, so when the moving terminals are moved with rotation of the caps, the parallel connection mode and the series connection mode are changed.

15. The apparatus of claim 1, wherein the heat sink includes a flexible material and is formed by one plate that is laterally divided by separation lines that are formed in the longitudinal direction, and a cylindrical configuration is achieved by rolling the heat sink and connecting both lateral ends of the heat sink.

16. The apparatus of claim 1, wherein the heat sink is laterally divided into two parts by two separation lines that are formed in the longitudinal direction, and one of the two parts is hinged to turn and the other one of the two parts is provided with a locking device for fixing the two parts such that the heat sink can be opened and closed.

* * * * *